United States Patent
Mitsui

(10) Patent No.: US 9,398,708 B2
(45) Date of Patent: Jul. 19, 2016

(54) OPENING AND CLOSING DEVICE

(71) Applicant: MITSUBISHI STEEL MFG. CO., LTD., Tokyo (JP)

(72) Inventor: Yasuhiro Mitsui, Chiba (JP)

(73) Assignee: MITSUBISHI STEEL MFG. CO., LTD., Tokyo (JP)

( * ) Notice: Subject to any disclaimer, the term of this patent is extended or adjusted under 35 U.S.C. 154(b) by 0 days.

(21) Appl. No.: 14/372,038

(22) PCT Filed: Oct. 8, 2013

(86) PCT No.: PCT/JP2013/077350
§ 371 (c)(1),
(2) Date: Jul. 14, 2014

(87) PCT Pub. No.: WO2014/065113
PCT Pub. Date: May 1, 2014

(65) Prior Publication Data
US 2014/0352221 A1   Dec. 4, 2014

(30) Foreign Application Priority Data

Oct. 26, 2012   (JP) ................................. 2012-237172

(51) Int. Cl.
*H05K 5/02* (2006.01)
*G03B 17/04* (2006.01)
(Continued)

(52) U.S. Cl.
CPC .............. *H05K 5/0239* (2013.01); *G03B 17/04* (2013.01); *G06F 1/1679* (2013.01);
(Continued)

(58) Field of Classification Search
CPC ...... G03B 17/02; G03B 17/04; E06B 3/5009; E06B 3/509
See application file for complete search history.

(56) References Cited

U.S. PATENT DOCUMENTS 2,693,622 A * 11/1954 Brenner .......................... 49/81.1
2,967,334 A *  1/1961 Abelson ......................... 49/81.1
(Continued)

FOREIGN PATENT DOCUMENTS

GB        1003695    *  3/1962  ............... E04F 3/50
JP      2001-230951      8/2001
(Continued)

OTHER PUBLICATIONS

International Search Report mailed on Jan. 14, 2014.
(Continued)

*Primary Examiner* — Katherine Mitchell
*Assistant Examiner* — Catherine A Kelly
(74) *Attorney, Agent, or Firm* — IPUSA, PLLC

(57) ABSTRACT

An opening and closing device includes a base plate rotatably supported by a stand to rotate between closed and open positions, a sliding plate slidably provided on the base plate to slide between first and second positions, an urging part to urge the sliding plate toward the second position, where the sliding plate projects from the base plate, a movement restriction mechanism including first and second members provided on one and the other, respectively, of the stand and the sliding plate, and configured to restrict the movements of the base plate and the sliding plate by the engagement of the first and second members when the base plate is at the closed position, and a moving and urging mechanism to move and urge the sliding plate toward the first position from the second position with the movement of the base plate from the open position to the closed position.

9 Claims, 12 Drawing Sheets

(51) Int. Cl.
    *H04M 1/02*         (2006.01)
    *H05K 5/03*         (2006.01)
    *G06F 1/16*         (2006.01)

(52) U.S. Cl.
    CPC .......... *G06F 1/1681* (2013.01); *H04M 1/0216* (2013.01); *H04M 1/0237* (2013.01); *H05K 5/0226* (2013.01); *H05K 5/03* (2013.01)

(56) References Cited

U.S. PATENT DOCUMENTS

| | | | | |
|---|---|---|---|---|
| 3,030,671 A | * | 4/1962 | Jones | 49/81.1 |
| 3,154,822 A | * | 11/1964 | Smith | 49/246 |
| 3,430,383 A | * | 3/1969 | Brenner | 49/80.1 |
| 8,238,986 B2 | * | 8/2012 | Lee et al. | 455/575.4 |
| 8,351,193 B2 | * | 1/2013 | Huang et al. | 361/679.17 |
| 2011/0287819 A1 | | 11/2011 | Lee et al. | |
| 2012/0222268 A1 | | 9/2012 | Yamaguchi | |

FOREIGN PATENT DOCUMENTS

| | | |
|---|---|---|
| JP | 2003-110885 | 4/2003 |
| JP | 2006-138959 | 6/2006 |
| JP | 2010-035145 | 2/2010 |
| WO | 2010/093117 | 8/2010 |

OTHER PUBLICATIONS

Extended European Search Report mailed Oct. 7, 2015.

\* cited by examiner

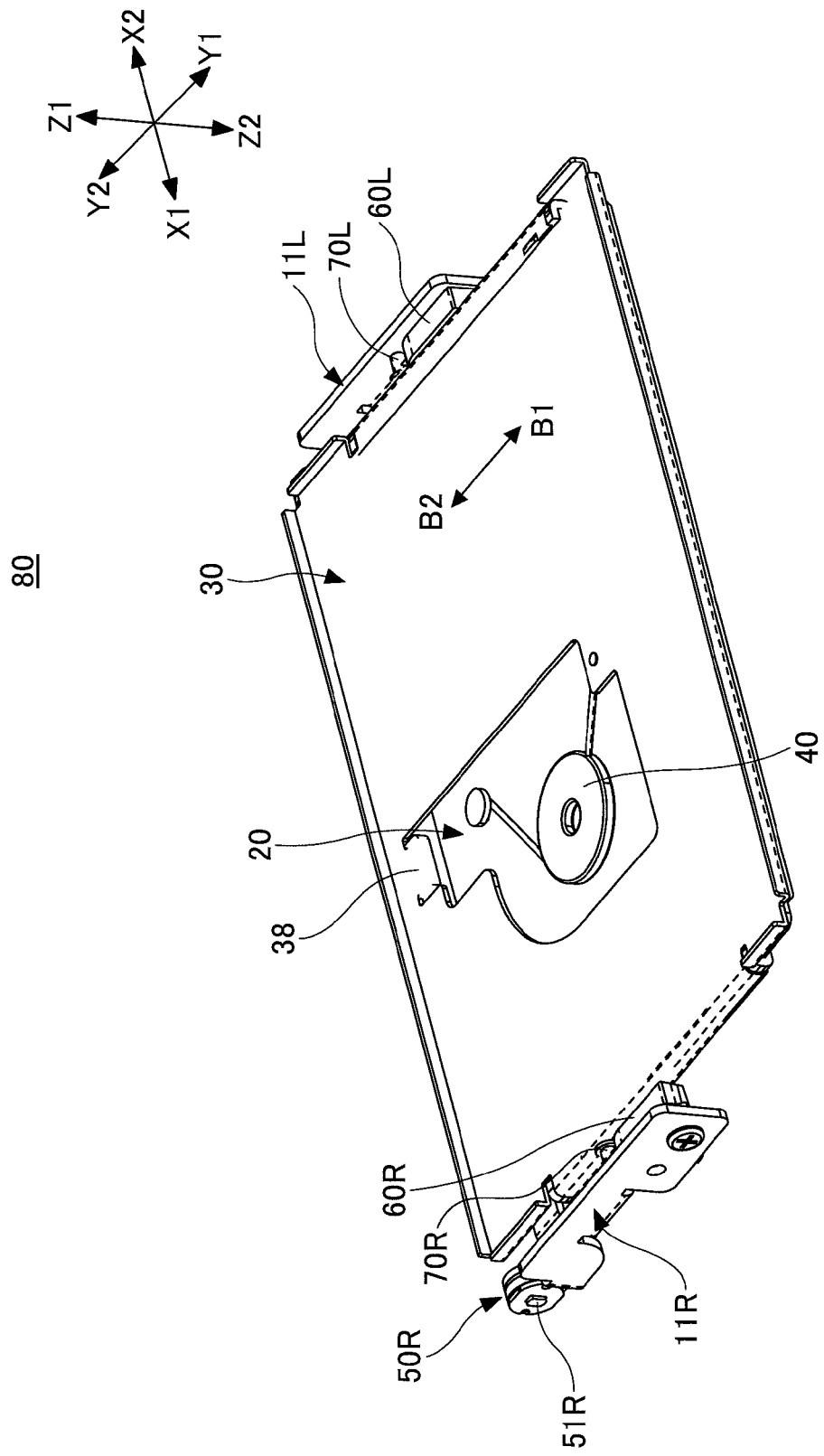

OPENING AND CLOSING DEVICE

TECHNICAL FIELD

The present invention relates to opening and closing devices such as an opening and closing device used to open and close a first housing and a second housing relative to each other.

BACKGROUND ART

Of the electronic devices such as digital cameras, video cameras, and cellular phones, those having a liquid crystal display incorporated in a device body to view captured images on a screen have been known. Furthermore, electronic devices having a display part movable relative to a device body in order to allow a liquid crystal display to be viewed from various angles have also been provided.

According to these kinds of electronic devices, usually, the display part is accommodated on the backside of the device body, and the liquid crystal display of the display part is viewable in this accommodated state. Depending on image capturing conditions such as an image capturing position, the liquid crystal display may not be viewed with the display part in the accommodated state. In this case, the display part is moved from the device body so as to be viewable even under the above-described image capturing condition.

In recent years, capturing one's own images using an electronic device such as a digital camera (so-called selfie taking) has been performed. In this case, with the display part being accommodated on the backside of the device body, a person who captures an image, who is in front of the device body, is prevented from viewing the liquid crystal display. Therefore, an electronic device has been provided that has a display part movable to a position where it is possible to view a liquid crystal display even when a person who captures an image is positioned in front of a device body (Patent Document 1).

PRIOR ART DOCUMENT

Patent Document

[Patent Document 1] Japanese Laid-Open Patent Application No. 2006-138959

SUMMARY OF THE INVENTION

Problems to be Solved by the Invention

The display part provided with a liquid crystal display, however, has a relatively large thickness. Therefore, simply causing the display part to rotate about an axis of rotation relative to the device body causes the respective corner parts of the display part and the device body on the side closer to the axis of rotation to come into contact with each other with the rotation.

Furthermore, it is desired for an electronic device provided with an opening and closing mechanism to prevent a hinge connecting a display part and a device body from being viewed from outside for better designing. In this case, the above-described issue becomes particularly important.

Furthermore, in order to avoid this contact, it is possible to use a hinge having two parallel axes between the display part and the device body as disclosed in Patent Document 1. According to a configuration using a biaxial hinge, however, there is a problem in that the moving operation of the display part becomes unstable because of its two axes of rotation and that its opening and closing operation is a two-action motion including two actions, thus resulting in poor operability.

The present invention is made in view of the above-described points, and has an object of providing an opening and closing device capable of stably causing a first housing and a second housing to be opened and closed relative to each other while being reduced in size.

Means for Solving the Problems

According to an aspect of the present invention, an opening and closing device includes a stand; a base plate rotatably supported by the stand so as to rotate between a closed position and an open position; a sliding plate slidably provided on the base plate so as to slide between a first position where the sliding plate is superposed on the base plate and a second position where the sliding plate projects from the base plate; an urging part configured to urge the sliding plate toward the second position relative to the base plate; a movement restriction mechanism including a first member provided on one of the stand and the sliding plate and a second member provided on the other of the stand and the sliding plate, wherein the movement restriction mechanism is configured to restrict a movement of the base plate relative to the stand and a movement of the sliding plate relative to the base plate by an engagement of the first member and the second member when the base plate is at the closed position; and a moving and urging mechanism configured to move and urge the sliding plate toward the first position from the second position with a movement of the base plate from the open position to the closed position.

Effects of the Invention

According to an opening and closing device of an embodiment of the present invention, it is possible to cause an electronic device in which the opening and closing device is provided to be stably opened and closed. Furthermore, it is possible to improve operability because a sliding plate automatically moves to a first position before sliding in a single action with the movement of a base plate to a closed position.

BRIEF DESCRIPTION OF THE DRAWINGS

FIG. 7 is a perspective view of an opening and closing device which is a variation of the embodiment.

DESCRIPTION OF EMBODIMENTS

Next, a description is given, with reference to the accompanying drawings, of an embodiment of the present invention.

Figure 1:
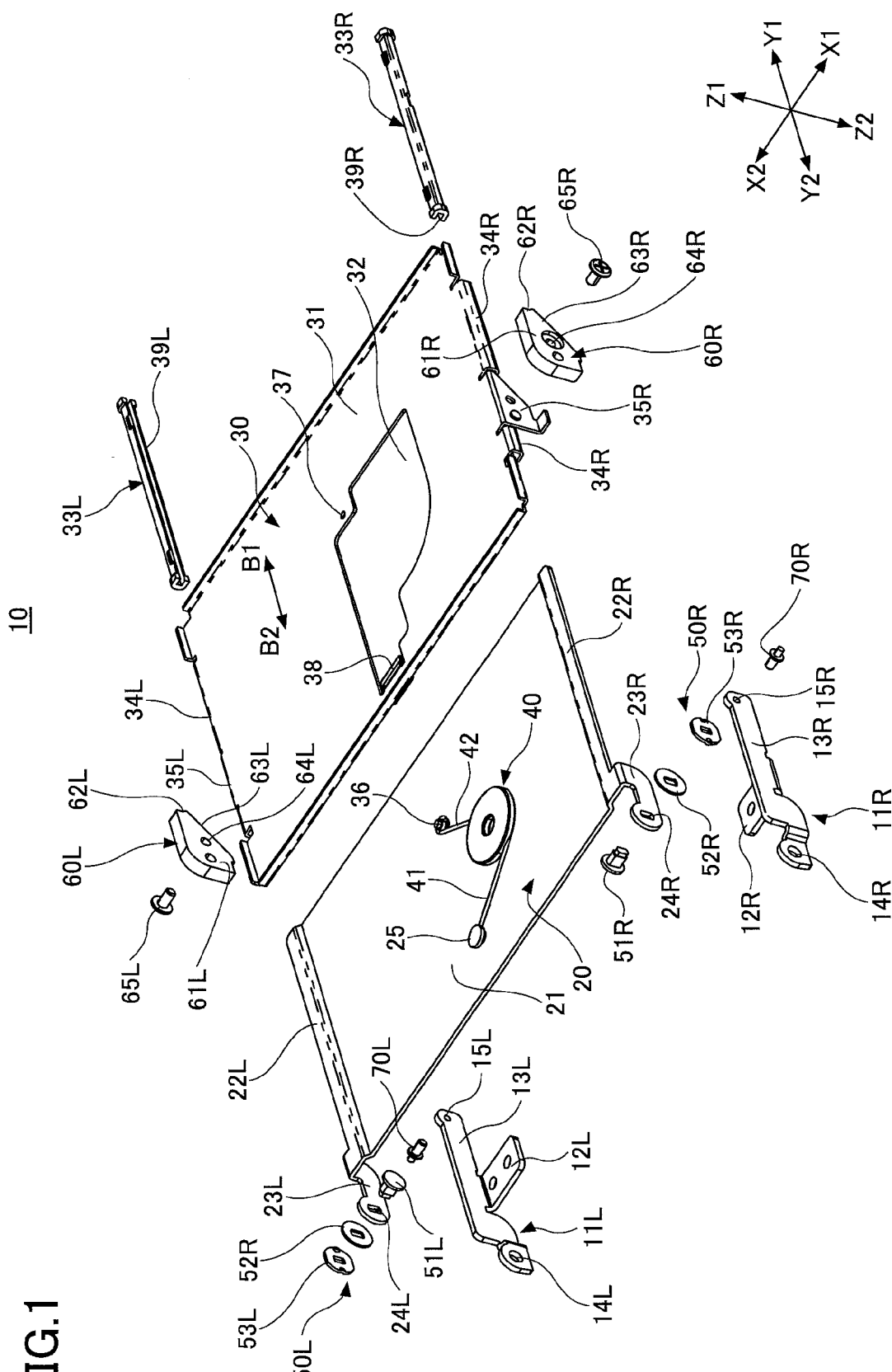
FIG. 1 is an exploded perspective view of an opening and closing device according to an embodiment of the present invention.
Figure 2A:
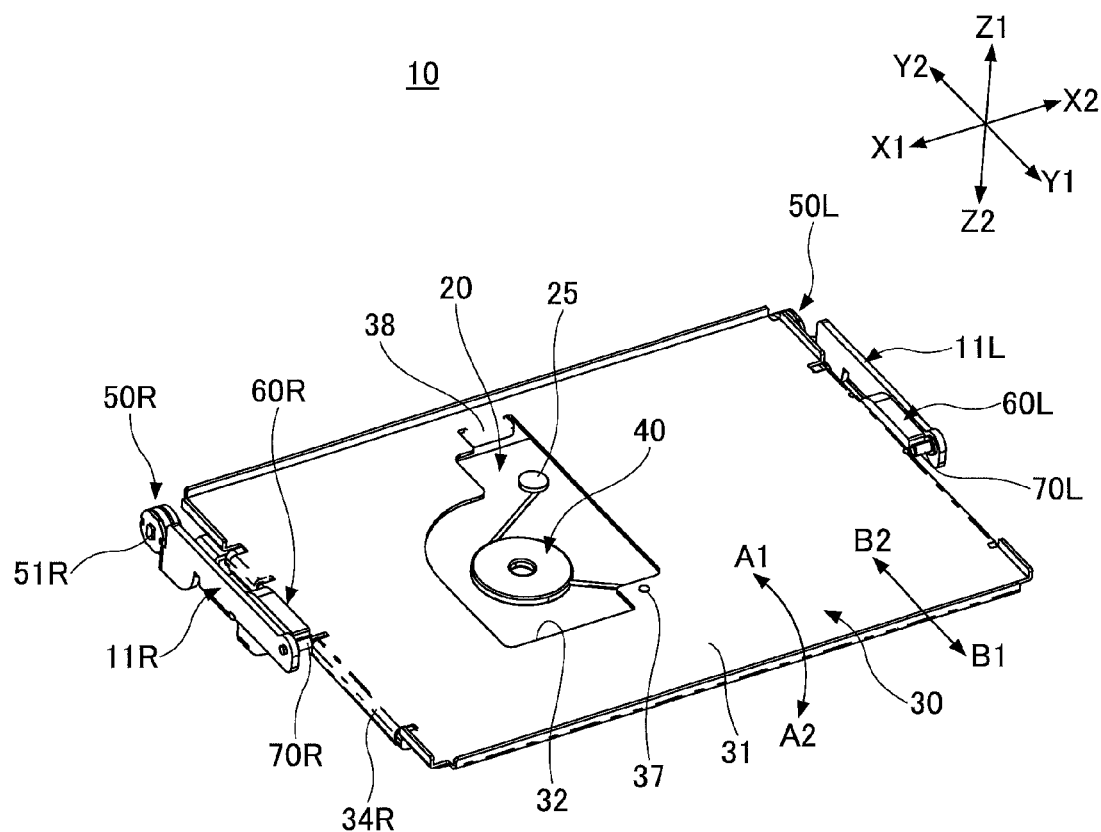
FIG. 2A is a perspective view of the opening and closing device in a closed state according to the embodiment of the present invention.
Figure 2B:
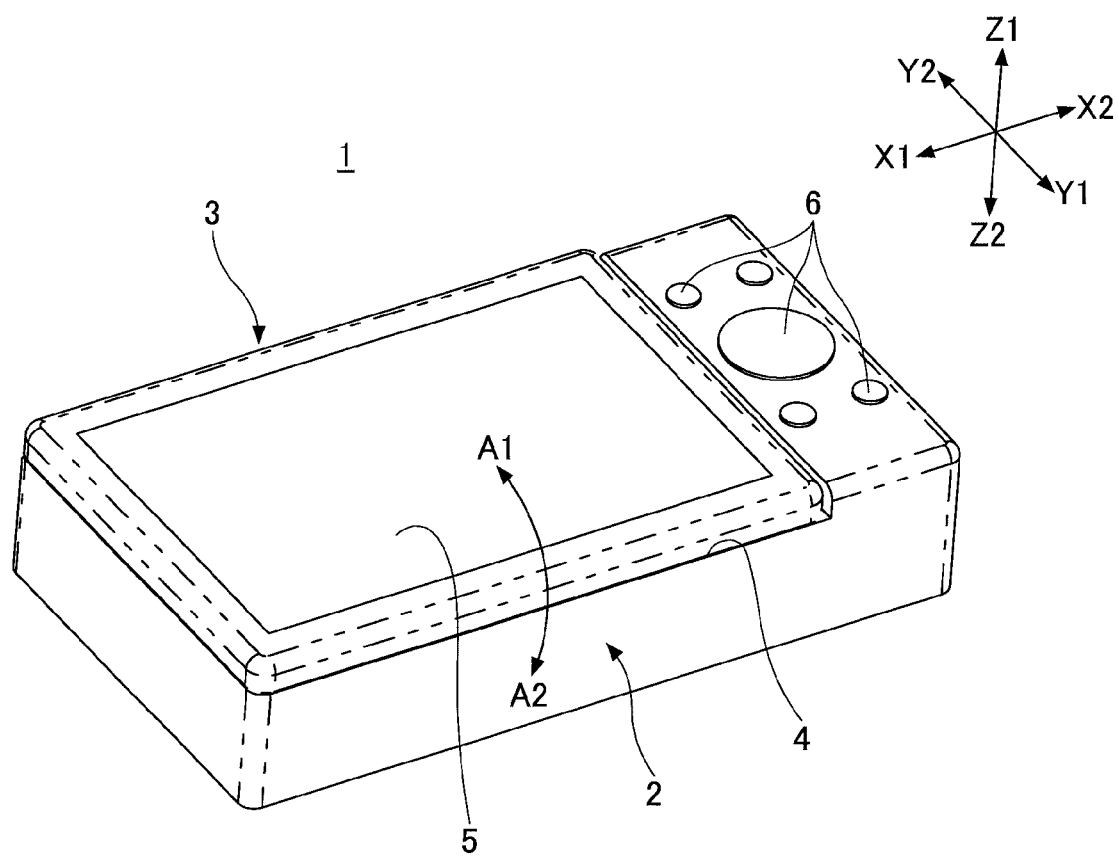
FIG. 2B is a perspective view of an electronic device in a closed state, in which the opening and closing device is provided, according to the embodiment of the present invention.
Figure 3A:
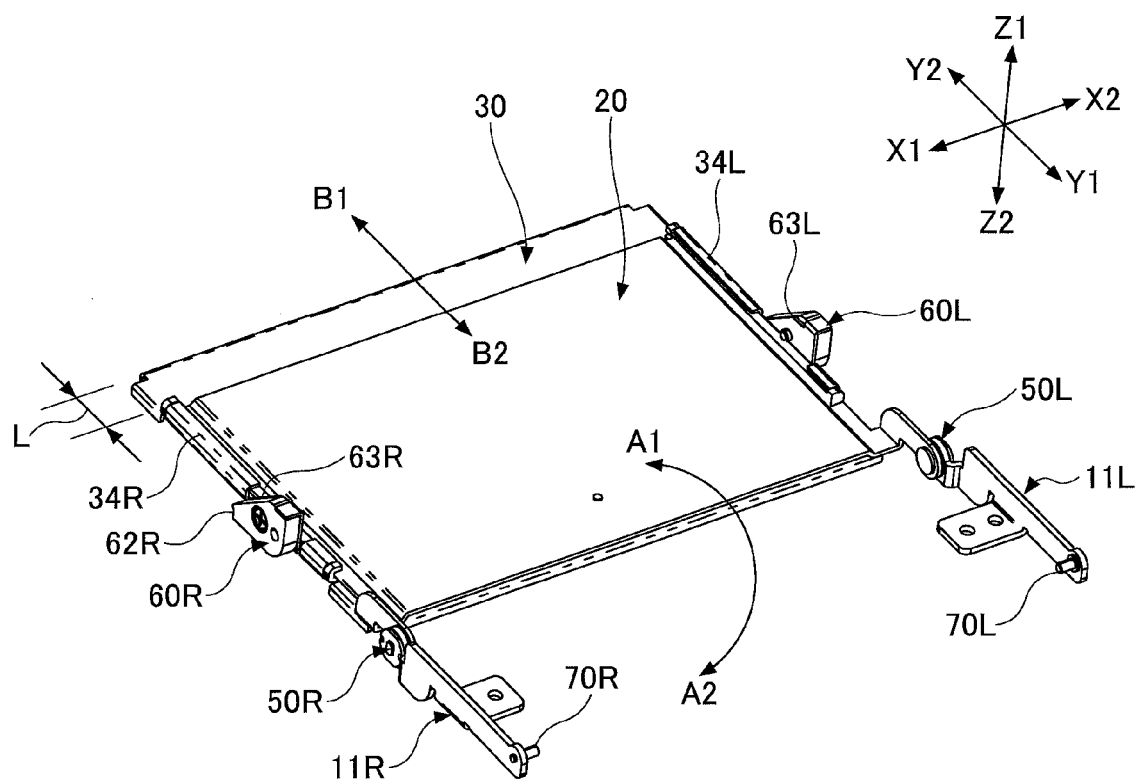
FIG. 3A is a perspective view of the opening and closing device in an open state according to the embodiment of the present invention.
Figure 3B:
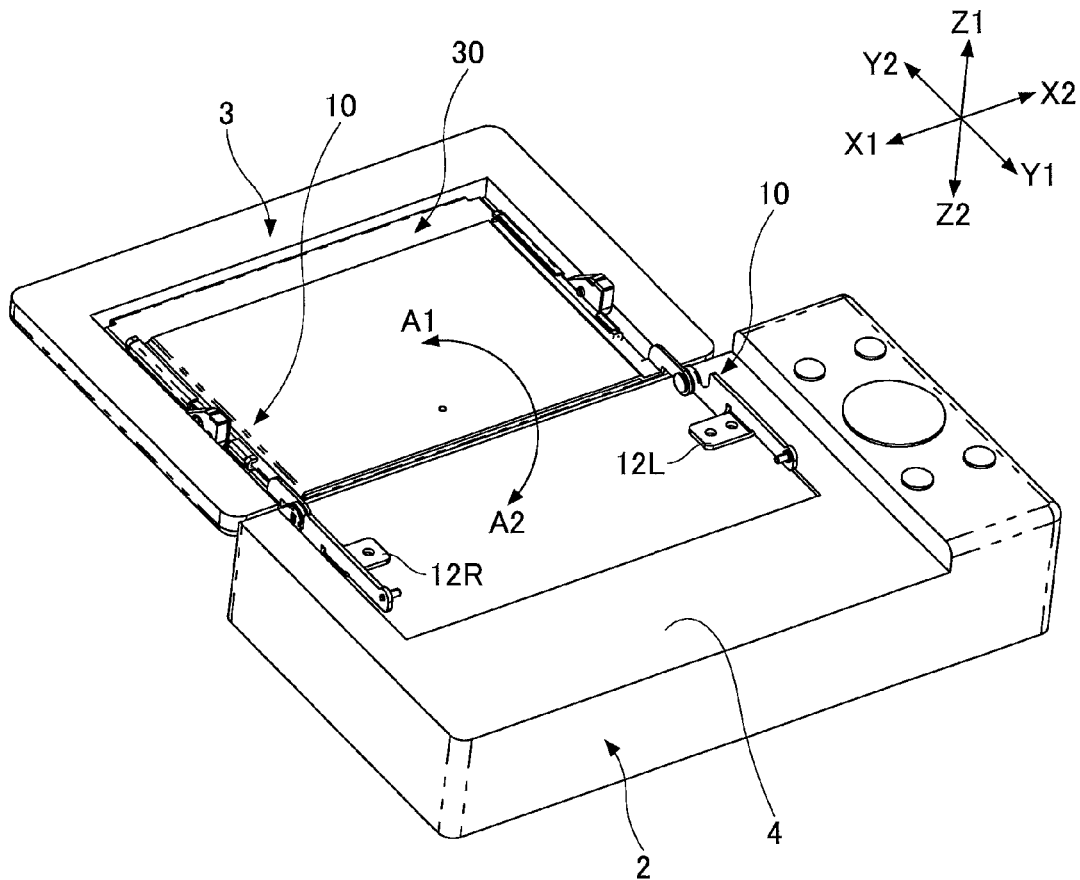
FIG. 3B is a perspective view of the electronic device in an open state according to the embodiment of the present invention.

FIG. 1, FIGS. 2A and 2B, and FIGS. 3A and 3B are diagrams for illustrating an opening and closing device 10 according to an embodiment of the present invention. FIG. 1 is an exploded perspective view of the opening and closing device 10. FIG. 2A is a perspective view of the opening and closing device 10 in a closed state, and FIG. 2B is a perspective view of an electronic device 1 in a closed state, in which the opening and closing device 10 is provided. FIG. 3A is a perspective view of the opening and closing device 10 in an open state, and FIG. 3B is a perspective view of the electronic device 1 in an open state.

The opening and closing device 10 according to this embodiment is provided in, for example, the electronic device 1 as illustrated in FIG. 2B and FIG. 3B, and operates to cause a display part 3 to move to be opened and closed relative to a device body 2.

First, a description is given of the electronic device 1 in which the opening and closing device 10 is provided. In this embodiment, a description is given, taking a digital camera as an example of the electronic device 1. The present invention may be applied to not only digital cameras but also a wide range of electronic devices that have a movable part (for example, the display part 3) relative to the device body 2, such as video cameras and cellular phones.

The electronic device 1 includes the device body 2 (a first casing) and the display part 3 (a second casing). FIG. 2B and FIG. 3B illustrate the backside of the electronic device 1, on which side the display part 3, switches 6, etc., are provided.

Furthermore, an imaging lens for capturing an image (not graphically illustrated), etc., are provided on the front side of the electronic device 1.

The display part 3 includes a liquid crystal display 5, so that an image captured through the imaging lens is displayed on the liquid crystal display 5. Accordingly, it is possible for a person who captures an image to view an image to be captured on the liquid crystal display 5. When capturing an image in a usual manner, the display part 3 is accommodated inside a display part accommodating part 4 of the display part 3 as illustrated in FIG. 2B, so that the display part 3 and the device body 2 are integrated. The state of the electronic device 1 and the opening and closing device 10, where the display part 3 is accommodated inside the display part accommodating part 4, is referred to as "closed state."

As described above, in recent years, capturing one's own images using an electronic device (so-called selfie taking) has been performed, and the electronic device 1 and the opening and closing device 10 are so configured as to enable this "selfie taking." Specifically, the display part 3 is so configured as to be movable (rotatable) in directions indicated by arrows A1 and A2 in FIGS. 2A and 2B and FIGS. 3A and 3B relative to the device body 2 by the opening and closing device 10. FIG. 3B illustrates a state where the display part 3 is opened relative to the device body 2. The state of the electronic device 1 and the opening and closing device 10, where the display part 3 is opened relative to the device body 2, is referred to as "open state".

In this open state, the imaging lens and the liquid crystal display 5 provided in the device body 2 are positioned on the front side of the electronic device 1. Therefore, in the case of performing so-called selfie taking, it is possible for a person who captures an image to capture an image while viewing herself/himself on the liquid crystal display 5.

Next, a description is given of a configuration of the opening and closing device 10. Referring to FIG. 1, FIG. 2A, and FIG. 3A, the opening and closing device 10 includes stands 11L and 11R, a base plate 20, a sliding plate 30, a spring 40, hinge mechanisms 50L and 50R, and engaging pins 70L and 70R. With respect to elements that are provided in symmetry in horizontal directions (the X1 and the X2 direction in the drawings), the element provided on the X1 direction side (the right side in FIG. 1) is denoted by a reference numeral with a subscript "R" and the element provided on the X2 direction side (the left side in FIG. 1) is denoted by a reference numeral with a subscript "L."

Each of the stands 11L and 11R is formed by subjecting a metal plate material to press forming. The stand 11L includes a fixation part 12L and a standing part 13L, which are formed as a unit. The stand 11R includes a fixation part 12R and a standing part 13R, which are formed as a unit. The fixation parts 12L and 12R are fixed to the device body 2 using screws or the like as illustrated in FIG. 3B. Furthermore, shaft holes 14L and 14R for attaching hinge pins 51L and 51R are formed in one end portions of the standing parts 13L and 13R, respectively. Pin fixing holes 15L and 15R for fixing engaging pins 70L and 70R are formed in other end portions of the standing parts 13L and 13R, respectively. The standing parts 13L and 13R are shaped to extend in directions indicated by arrows Y1 and Y2 relative to the fixation parts 12L and 12R, respectively, serving as a center.

The base plate 20 is formed by subjecting a metal plate material to press forming. The base plate 20 includes a base body part 21, guide rail parts 22L and 22R, and arm parts 23L and 23R, all of which are formed as a unit. The base body part 21 has a substantially rectangular shape. The guide rail parts 22L and 22R are formed at short-side (X2-direction side and X1-direction side, respectively) side edges of the base body part 21.

Furthermore, the arm parts 23L and 23R are formed in the Y2-direction side end portions of the base body part 21 at its short-side side edges. Each of the arm parts 23L and 23R has a letter L shape in a side view. The arm parts 23L and 23R have respective one end portions continuous with the base body part 21. Shaft holes 24L and 24R for inserting the hinge pins 51L and 51R are formed in other end portions of the arm parts 23L and 23R, respectively.

The spring 40 (an urging part) is provided at a substantial center position of the base body part 21. The spring 40, which is not limited to a particular kind as long as the spring 40 is capable of applying an elastic force between the base plate 20 and the sliding plate 30, employs a torsion spring in this embodiment.

The spring 40 includes an arm part 41 and an arm part 42. The arm part 41 is fixed to the base body part 21 by a spring pin 25. The arm part 42 is fixed to the sliding plate 30 by fixing a spring pin 36 to a pix fixing hole 37. As a consequence, the spring 40 is provided between the base plate 20 and the sliding plate 30.

The sliding plate 30 is formed by subjecting a metal plate material to press forming. The sliding plate 30 includes a sliding body part 31, an opening part 32, guide attachment parts 34L and 34R, cam attachment parts 35L and 35R, and a contacting part 38. The sliding plate 30 is fixed to the display part 3 of the electronic device 1 as illustrated in FIG. 3B.

The sliding body part 31 has a substantially rectangular shape. The opening part 32 is formed in a substantial center portion of the sliding body part 31. The spring 40 is provided in the opening part 32. The contacting part 38, which serves as a stopper of the sliding plate 30, is formed at an end portion of the opening part 32 in a direction indicated by an arrow B2 in FIG. 1, FIG. 2A, and FIG. 3A.

The guide attachment parts 34L and 34R and the cam attachment parts 35L and 35R are formed as a unit with the sliding body part 31 at short-side (X2-direction side and X1-direction side, respectively) side edges of the sliding body part 31. Both short-side end portions of the sliding body part 31 are bent into a substantial angular letter C shape to form the guide attachment parts 34L and 34R. Sliding guides 33L and 33R are attached to the guide attachment parts 34L and 34R, respectively.

The sliding guides 33L and 33R are resin molding products formed of resin, which has high durability and good slidability. Furthermore, grooves 39L and 39R, which extend in the Y1 and the Y2 direction in FIG. 1, are formed inside the sliding guides 33L and 33R, respectively. The sliding guides 33L and 33R are attached to the guide attachment parts 34L and 34R, respectively. The attachment method is not limited in particular. For example, the sliding guides 33L and 33R and the guide attachment parts 34L and 34R may be engaged by providing engagement parts, fixed using an adhesive agent, or provided as a unit at the time of press working of the sliding plate 30.

The cam attachment parts 35L and 35R are formed to extend downward from the short-side end portions of the sliding body part 31. Cam members 60L and 60R are fixed to the cam attachment parts 35L and 35R, respectively. According to this embodiment, insertion holes 64L and 64R are formed in the cam members 60L and 60R, respectively. The cam members 60L and 60R are fixed to the cam attachment parts 35L and 35R by inserting fixing screws 65R and 65L into the insertion holes 64L and 64R and screwing the fixing screws 65L and 65R to screw holes formed in the cam attachment parts 35L and 35R, respectively.

Alternatively, the cam members 60L and 60R may be fixed to the cam attachment parts 35L and 35R by forming caulking parts in the cam attachment parts 35L and 35R and fixing the cam members 60L and 60R to the cam attachment parts 35L and 35R using the caulking parts or the cam members 60L and 60R may be fixed to the cam attachment parts 35L and 35R using an adhesive agent.

The cam members 60L and 60R are formed of resin, which has high durability and good slidability. The cam members 60L and 60R include cam body parts 61L and 61R, which have a substantially triangular shape, engaging recesses 62L and 62R, slopes 63L and 63R, and the insertion holes 64L and 64R, respectively. The engaging recesses 62L and 62R, the slopes 63L and 63R, and the insertion holes 64L and 64R are formed as a unit with the cam body parts 61L and 61R, respectively.

The engaging recesses 62L and 62R are depressed portions that engage with the below-described engaging pins 70L and 70R, respectively, and are formed at respective one corners of the cam body parts 61L and 61R of a substantially triangular shape. The engaging recesses 62L and 62R are so provided as to be positioned beside the guide attachment parts 34L and 34R, respectively. Furthermore, the engaging recesses 62L and 62R are formed in respective end portions of the cam body parts 61L and 61R in a direction indicated by an arrow B1 in FIG. 1, FIG. 2A, and FIG. 3A. This direction indicated by the arrow B1 is the same as a direction in which the sliding plate 30 is urged relative to the base plate 20 by the spring 40. The directions of the arrows B1 and B2 in the drawings are directions in which the below-described sliding plate 30 slides.

The slopes 63L and 63R are inclined surfaces formed in lower surfaces of the cam body parts 61L and 61R, respectively. The slopes 63L and 63R are formed so that the cam body parts 61L and 61R widen in the direction of the arrow B2 as illustrated in FIG. 1.

The hinge mechanisms 50L and 50R connect the stands 11L and 11R and the base plate 20 so that the base plate 20 is rotatable relative to the stands 11L and 11R. The hinge mechanisms 50L and 50R include the hinge pins 51L and 51R, spacers 52L and 52R, and click plates 53L and 53R, respectively.

Next, a description is given of a method of assembling the opening and closing device 10.

In assembling the opening and closing device 10, first, the stands 11L and 11R and the base plate 20 are connected. At this point, the engaging pins 70L and 70R are attached in advance to the stands 11L and 11R, respectively.

As described above, the stands 11L and 11R and the base plate 20 are connected using the hinge mechanisms 50L and 50R. In connecting the stands 11L and 11R and the base plate 20 using the hinge mechanisms 50L and 50R, first, the spacers 52L and 52R are inserted between the arm parts 23L and 23R and the stands 11L and 11R, respectively. Then, in this state, the shaft holes 14L and 14R of the stands 11L and 11R are aligned with (positioned relative to) the shaft holes 24L and 24R of the arm parts 23L and 23R, respectively.

After the completion of this positioning, the hinge pins 51L and 51R are inserted through the shaft holes 24L and 24R, the spacers 52L and 52R, and the shaft holes 14L and 14R, respectively, from the inside to the outside. Then, the click plates 53L and 53R are fixed to end portions of the hinge pins 51L and 51R, respectively, which are projecting outward from the shaft holes 14L and 14R.

As a result, the base plate 20 and the sliding plate 30 attached to the base plate 20 are supported by the hinge mechanisms 50L and 50R serving as shafts so as to be rotatable relative to the stands 11L and 11R. Furthermore, the hinge mechanisms 50L and 50R are so-called free stop hinges, and are capable of retaining the base plate 20 at any rotation angle relative to the stands 11L and 11R.

The hinge mechanisms 50L and 50R do not necessarily have to be free stop hinges. For example, grooves or the like may be formed in the stands 11L and 11R to generate a click feeling at an open position and a closed position and optionally at predetermined angles between the open position and the closed position.

Next, the sliding plate 30 is prepared. The sliding plate 30 may be prepared in parallel with providing the above-described base plate 20 on the stands 11L and 11R.

In preparing the sliding plate 30, the sliding guides 33L and 33R are attached to the guide attachment parts 34L and 34R, respectively, and the cam members 60L and 60R are fixed to the cam attachment parts 35L and 35R, respectively. Furthermore, the contacting part 38 is provided at the end portion of the opening part 32 in the B2 direction as illustrated in FIG. 1 and FIG. 2A.

Next, the spring 40 is positioned inside the opening part 32, and the arm part 42 of the spring 40 is fixed to the sliding plate 30 using the spring pin 36. The pix fixing hole 37 is formed in the sliding plate 30, and the arm part 42 of the spring 40 is fixed to the sliding plate 30 by fitting the spring pin 36 into the pix fixing hole 37.

Once the sliding plate 30 is prepared as described above, then, the guide rail parts 22L and 22R are inserted into the grooves 39L and 39R of the sliding guides 33L and 33R, respectively. The guide rail parts 22L and 22R and the sliding guides 33L and 33R are slidable relative to each other. Thus, the sliding plate 30 is slidably attached to the base plate 20.

Furthermore, in providing the sliding plate 30 on the base plate 20, the other arm part 41 of the spring 40 attached to the sliding plate 30 is fixed to the base plate 20 using the spring pin 25. As a result, the spring 40 is provided between the base plate 20 and the sliding plate 30 so as to apply an elastic force between the base plate 20 and the sliding plate 30.

The spring 40 applies an elastic force to urge the sliding plate 30 outward (in the direction of the arrow B1) relative to the base plate 20. This elastic force of the spring 40 urges the sliding plate 30 to slide in the B1 direction relative to the base plate 20. The contacting part 38 formed on the sliding plate 30, however, comes into contact with the spring pin 25 fixed to the base plate 20 so as to prevent the sliding plate 30 from sliding any further.

The opening and closing device 10 is fabricated by the above-described operation. According to the above-described fabrication method, the sliding plate 30 is attached to the base plate 20 after attaching the base plate 20 to the stands 11L and 11R. Alternatively, the base plate 20 may also be attached to the stands 11L and 11R after attaching the sliding plate 30 to the base plate 20.

Next, a description is given, with reference to FIGS. 2A and 2B through FIGS. 6A and 6B, of movements of the opening and closing device 10 having the above-described configuration.

FIGS. 4A through 4E are side views of the opening and closing device 10, illustrating its movement. FIGS. 5A through 5E are side views of the electronic device 1 in which the opening and closing device 10 is provided, illustrating its movement. FIGS. 6A and 6B are enlarged perspective views of where the cam member 60R is provided.

Figure 4A:
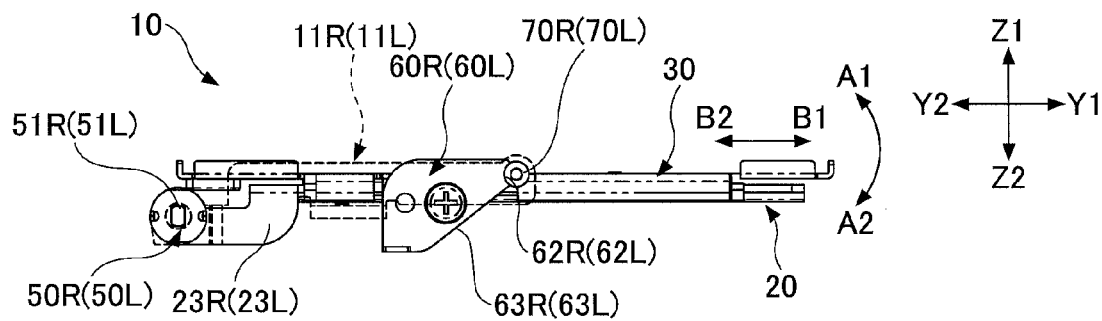
FIG. 4A is a side view of the opening and closing device for illustrating its movement according to the embodiment of the present invention.

FIGS. 3A and 3B, FIG. 4A, FIG. 5A, and FIG. 6A illustrate a closed state where the base plate 20 is closed relative to the stands 11L and 11R. At this point, the base plate 20 (the sliding plate 30) has been rotated in the direction of the arrow A2 in the drawings, so that the stands 11L and 11R, the base plate 20, and the sliding plate 30 are on top of one another in a side view as illustrated in FIG. 4A. In the following description, the position of the base plate 20 in this closed state is referred to as "closed position".

Furthermore, in the closed state, the sliding plate 30 has slid in the direction of the arrow B2 in the drawings against the elastic force of the spring 40. The outlines of the base plate 20 and the sliding plate 30 are substantially equal in a plan view (when viewed in a direction indicated by an arrow Z2 in the drawings). Accordingly, as a result of the sliding plate 30 being slid in the B2 direction in the closed state, the sliding plate 30 is superposed on the base plate 20. In the following description, the position of the sliding plate 30 in the closed state is referred to as "first position."

In the closed state, the engaging recesses 62L and 62R formed in the cam members 60L and 60R (a second member and an engaging member) are engaged with the engaging pins 70L and 70R (a first member and an engaging projection) attached to the stands 11L and 11R, respectively. (See FIG. 6A for the engagement of the engaging recess 62R and the engaging pin 70R.) Accordingly, although the sliding plate 30 is urged in the B1 direction by the elastic force of the spring 40, the cam members 60L and 60R come into contact with the engaging pins 70L and 70R, respectively, to prevent the sliding plate 30 from moving in the B1 direction. The engaging recesses 62L and 62R and the engaging pins 70L and 70R may form a movement restriction mechanism.

The engaging recesses 62L and 62R are depressed portions whose cross sections are semicircular so as to correspond to the shape of the columnar engaging pins 70L and 70R. Therefore, the engagement of the engaging recesses 62L and 62R and the engaging pins 70L and 70R is reliable in their engaged state. Furthermore, the engaging recesses 62L and 62R of the cam members 60L and 60R are pressed against the engaging pins 70L and 70R, respectively, by the elastic force of the spring 40. Therefore, there is no disengagement of the cam members 60L and 60R and the engaging pins 70L and 70R even if external impact is applied in the closed state. Accordingly, the display part 3 does not move from the device body 2 in response to application of impact, so that it is possible to improve the reliability of the electronic device 1.

Figure 5A:
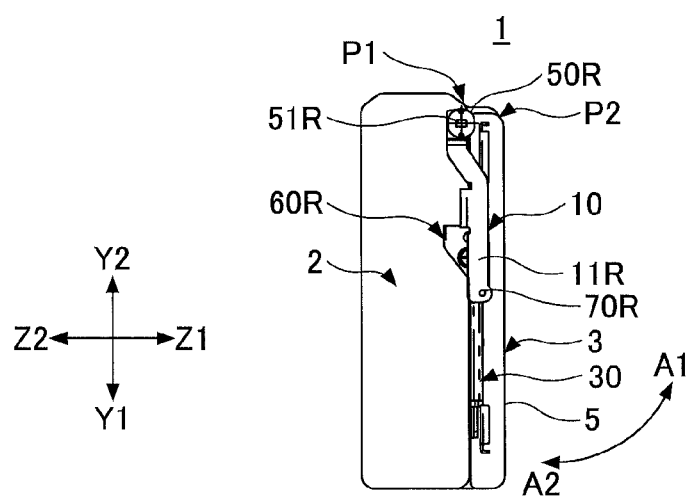
FIG. 5A is a side view of the electronic device for illustrating its movement according to the embodiment of the present invention.
Figure 6A:
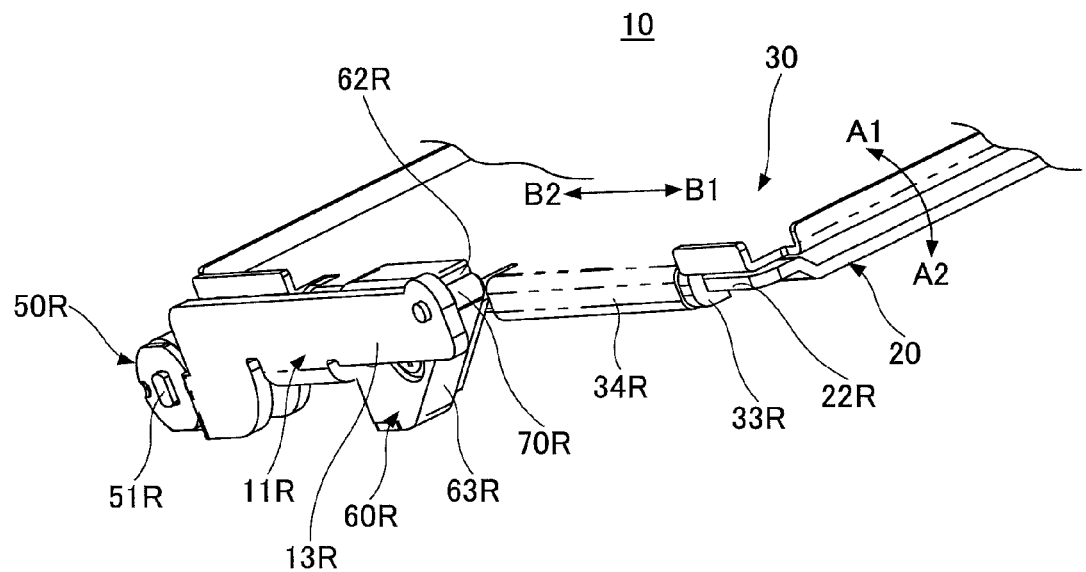
FIG. 6A is an enlarged perspective view of part of the opening and closing device, illustrating engagement of an engaging pin and a cam member, according to the embodiment of the present invention.
Figure 6B:
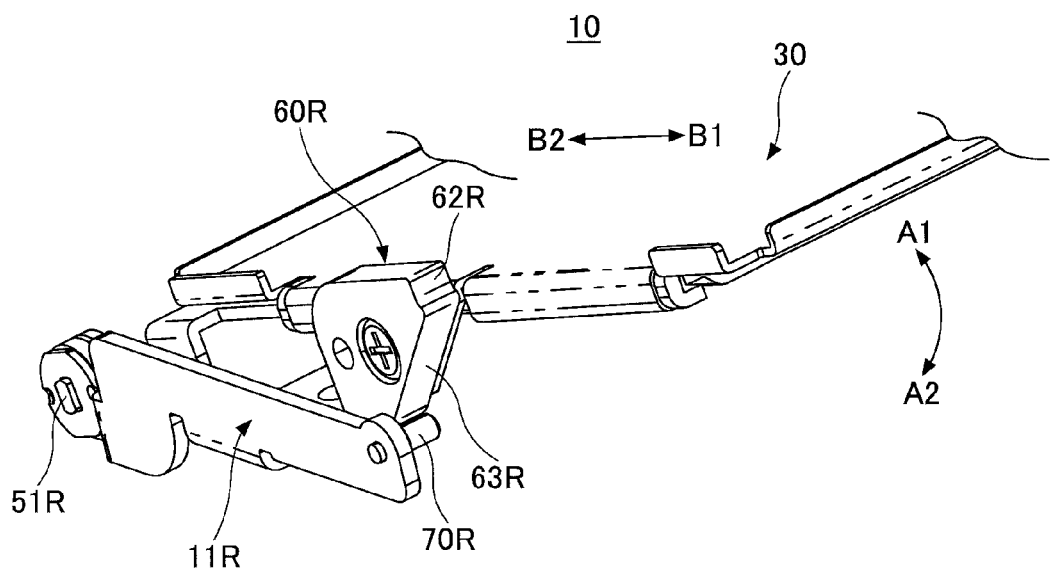
FIG. 6B is an enlarged perspective view of part of the opening and closing device, illustrating disengagement of the engaging pin and the cam member, according to the embodiment of the present invention.

FIG. 5A illustrates the electronic device 1 in the closed state. In this closed state, the display part 3 is accommodated inside the display part accommodating part 4 formed in the device body 2. The dimension of the display part 3 in the Y1 and the Y2 direction is substantially equal to the dimension of the device body 2 in the Y1 and the Y2 direction. This makes it possible to increase the shape of the display part 3, so that it is possible to employ the liquid crystal display 5 of large size. Furthermore, no step or gap is formed between the device body 2 and the display part 3 when the display part 3 is accommodated in the device body 2. Therefore, it is possible to improve designability.

In this closed state, a corner part of the device body 2 (indicated by an arrow P1 in FIGS. 5A through 5E) (hereinafter, "corner part P1") and a corner part of the display part 3 (indicated by an arrow P2 in FIGS. 5A through 5E) (hereinafter, "corner part P2") are close to each other.

Figure 4B:
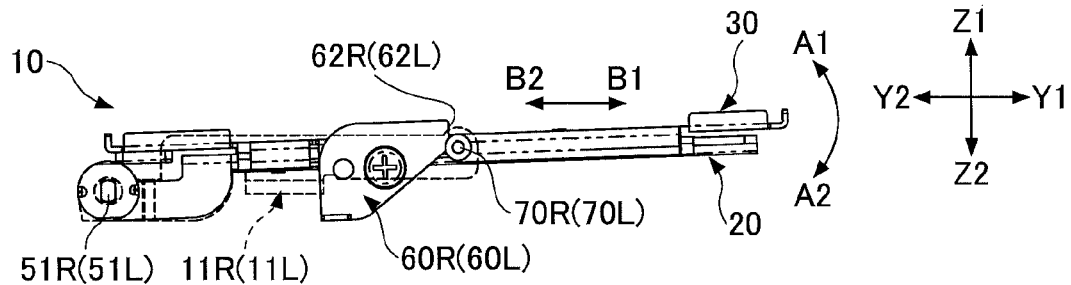
FIG. 4B is a side view of the opening and closing device for illustrating its movement according to the embodiment of the present invention.

In bringing the opening and closing device 10 from the above-described closed state into the open state, the base plate 20 and the sliding plate 30 are caused to rotate in the A1 direction relative to the stands 11L and 11R with such a force as to enable the engaging recesses 62L and 62R of the cam members 60L and 60R to climb over the engaging pins 70L and 70R, respectively. FIG. 4B illustrates a state immediately before the disengagement of the cam members 60L and 60R from the engaging pins 70L and 70R.

When the engaging recesses 62L and 62R climb over the engaging pins 70L and 70R, respectively, the sliding plate 30 moves slightly (for an amount corresponding to the depressions of the engaging recesses 62L and 62R) in the direction of the arrow B2 in the drawings relative to the base plate 20. A clearance corresponding to this movement is provided in advance between the base plate 20 and projecting portions provided at the respective ends of the sliding guides 33L and 33R in the direction of the arrow B2 in the drawings. As a result, the above-described movement of the sliding plate 30 is allowed.

Figure 4C:
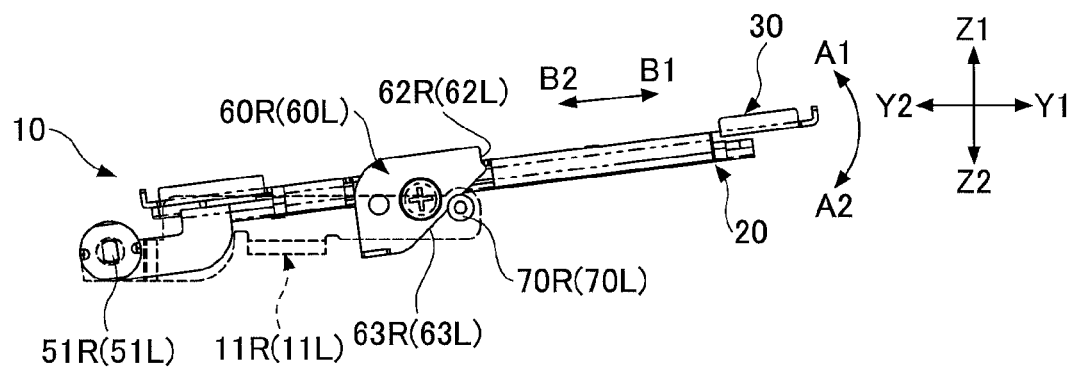
FIG. 4C is a side view of the opening and closing device for illustrating its movement according to the embodiment of the present invention.
Figure 5B:
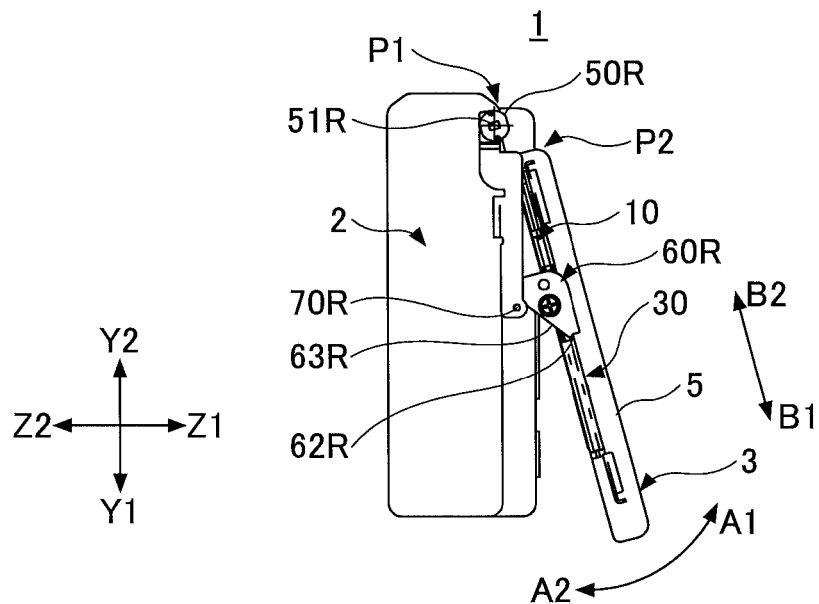
FIG. 5B is a side view of the electronic device for illustrating its movement according to the embodiment of the present invention.

FIG. 4C, FIG. 5B, and FIG. 6B illustrate a state where the engaging recesses 62L and 62R are disengaged from the engaging pins 70L and 70R, respectively, by causing the base plate 20 and the sliding plate 30 to further rotate in the A1 direction. As a result of the disengagement of the engaging recesses 62L and 62R from the engaging pins 70L and 70R, the restriction on the movement of the sliding plate 30 in the direction of the arrow B1 in the drawings by the engaging pins 70L and 70R is removed.

Thus, as a result of the disengagement of the engaging recesses 62L and 62R from the engaging pins 70L and 70R, the sliding plate 30 slides in the B1 direction relative to the base plate 20. At this point, as illustrated in FIG. 4C and FIG. 4D, the engaging pins 70L and 70R relatively slide on the slopes 63L and 63R of the cam members 60L and 60R, respectively.

Figure 4D:
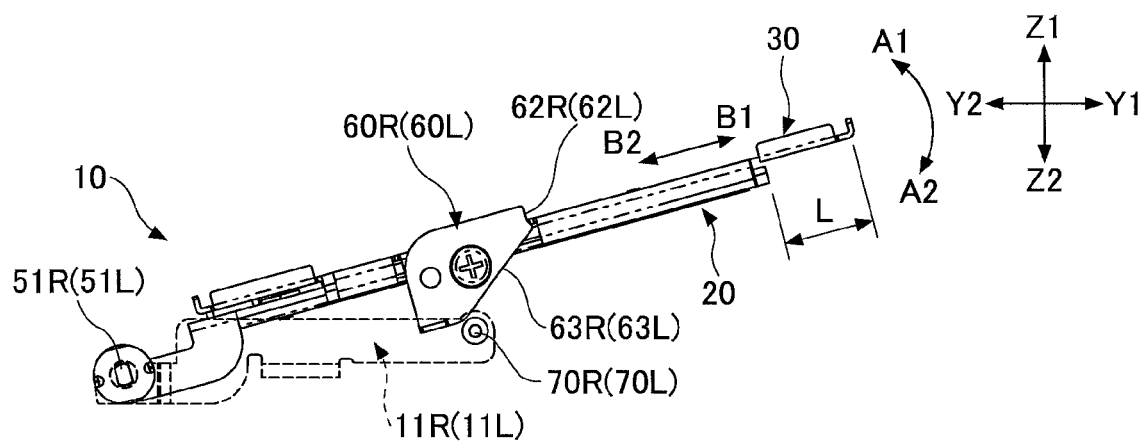
FIG. 4D is a side view of the opening and closing device for illustrating its movement according to the embodiment of the present invention.
Figure 4E:
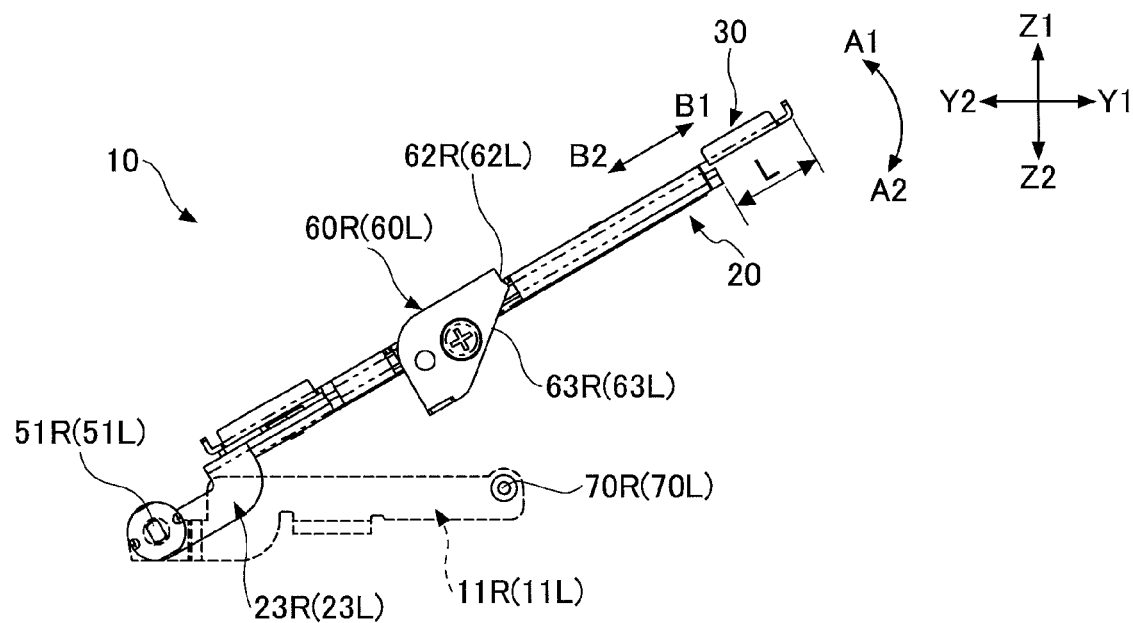
FIG. 4E is a side view of the opening and closing device for illustrating its movement according to the embodiment of the present invention.

When the cam members 60L and 60R are completely disengaged (separated) from the engaging pins 70L and 70R, respectively, as illustrated in FIG. 4E, the contacting part 38 (FIG. 1 and FIG. 2A), which forms part of the opening part 32 of the sliding plate 30, comes into contact with the spring pin 25, so that the sliding plate 30 is prevented from sliding in the B1 direction relative to the base plate 20. In the following, this position of the sliding plate 30, at which the sliding plate 30 is at its limit of movement in the B1 direction, is referred to as "second position."

When the sliding plate 30 is slid to the second position, the sliding plate 30 projects relative to the base plate 20 by the length (distance) indicated by an arrow L in FIGS. 4D and 4E. Furthermore, because the display part 3 is attached to the sliding plate 30, the display part 3 also slides in the B1 direction by the length L with the sliding of the sliding plate 30.

Figure 5C:
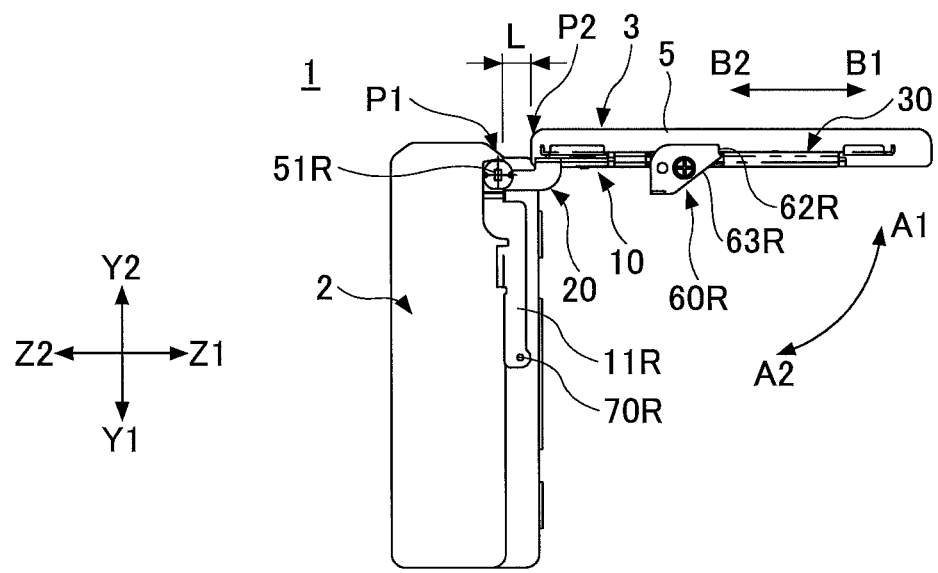
FIG. 5C is a side view of the electronic device for illustrating its movement according to the embodiment of the present invention.

FIG. 5C illustrates the electronic device 1, where the cam members 60L and 60R are completely disengaged from the engaging pins 70L and 70R, respectively. In FIG. 5C, the corner part P2 also is moved in the B1 direction by the distance L from its position in the closed state as a result of the above-described sliding of the display part 3 with the sliding plate 30. That is, as a result of the sliding of the sliding plate 30, the distance between the corner part P1 of the device body 2 and the corner part P2 of the display part 3 is greater than that in the closed state.

Figure 5D:
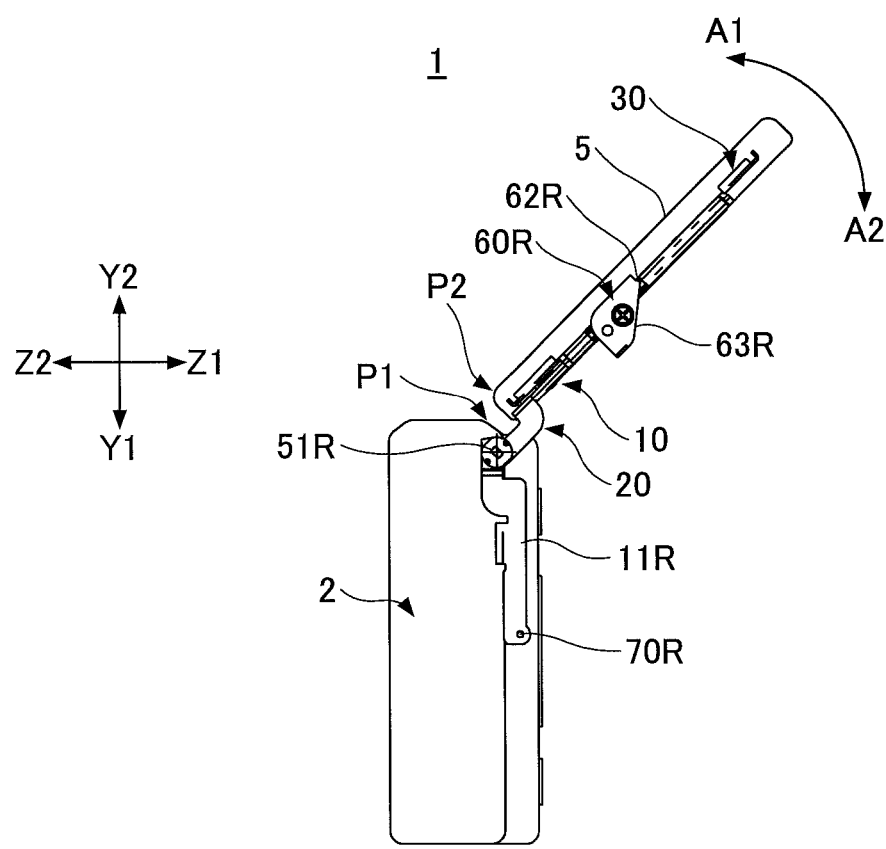
FIG. 5D is a side view of the electronic device for illustrating its movement according to the embodiment of the present invention.

When the display part 3 is caused to further rotate in the A1 direction from this state, the base plate 20 rotates about the hinge pins 51L and 51R relative to the stands 11L and 11R, and with this rotation of the base plate 20, the display part 3 also rotates relative to the device body 2. FIG. 5D illustrates a state where the base plate 20 is rotated approximately 135° relative to the closed position.

After the sliding plate 30 is slid in the direction of the arrow B1 in the drawings relative to the base plate 20 and moved to the second position, the sliding plate 30 rotates while keeping the second position. Accordingly, the corner part P1 of the device body 2 and the corner part P2 of the display part P2 also rotate while keeping a distance from each other.

Therefore, even when the display part 3 and the device body 2 are substantially equal in length in the directions of the arrows Y1 and Y2 in the drawings, the corner part P2 is prevented from coming into contact with the corner part P1 when the display part 3 rotates relative to the device body 2. Therefore, it is possible to smoothly open the display part 3 relative to the device body 2.

Figure 5E:
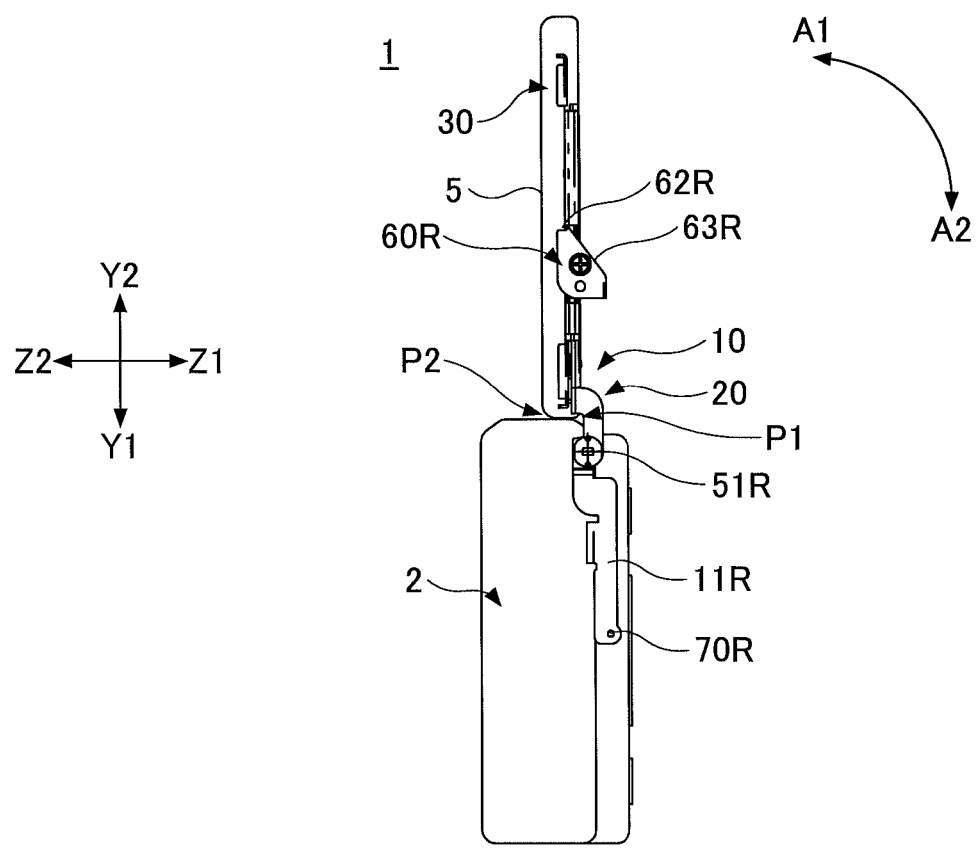
FIG. 5E is a side view of the electronic device for illustrating its movement according to the embodiment of the present invention.

FIG. 5E illustrates the electronic device 1 in the open state. In this open state, the liquid crystal display 5 provided in the display part 3 is oriented toward the front side (which is the Z2-direction side in FIG. 5E), so that it is possible to perform so-called selfie taking. In the following description, the position of the base plate 20 in the open state is referred to as "open position."

Next, a description is given of a movement of the opening and closing device 10 at the time of causing the base plate 20 to rotate from the open position to the closed position.

The movement at the time of causing the base plate 20 to rotate from the open position to the closed position is opposite to the above-described movement at the time of causing the base plate 20 to move from the closed position to the open position. Therefore, the movement at the time of causing the base plate 20 to rotate from the open position to the closed position is described using FIGS. 4A through 4E and FIGS. 5A through 5E, which are used in the above description of the movement at the time of causing the base plate 20 to rotate from the closed position to the open position.

In causing the display part 3 and the base plate 20 (the sliding plate 30) to move from the open state illustrated in FIGS. 3A and 3B and FIG. 5E to the closed position, the display part 3 and the base plate 20 are caused to move in the direction of the arrow A2 in the drawings. With this movement, the display part 3 and the base plate 20 rotates toward the closed position as illustrated in FIGS. 5D and 5C. At this point, the sliding plate 30 keeps the second position (the position at which the sliding plate 30 is slid in the direction of the arrow B1), so that the corner parts P1 and P2 keep a distance from each other. Therefore, the corner parts P1 and P2 are prevented from coming into contact with each other when the display part 3 moves from the open position to the closed position.

When the display part 3 and the base plate 20 rotate a predetermined amount, the cam members 60L and 60R fixed to the sliding plate 30 engage with the engaging pins 70L and 70R provided on the stands 11L and 11R, respectively. FIG. 4D and FIG. 5B illustrate a state immediately after the engagement of the cam members 60L and 60R with the engaging pins 70L and 70R. As illustrated in FIG. 4D, first, the engaging pins 70L and 70R engage with lower end portions of the slopes 63L and 63R formed on the cam members 60L and 60R, respectively.

When the display part 3 and the base plate 20 are caused to further rotate in the direction of the arrow A2 in the drawings from the state illustrated in FIG. 4D, the engaging pins 70L and 70R relatively move on the slopes 63L and 63R, respectively. Specifically, the engaging pins 70L and 70R relatively move upward on the slopes 63L and 63R, respectively.

As a result of the engaging pins 70L and 70R thus relatively moving upward on the slopes 63L and 63R, the cam members 60L and 60R are urged to move in the direction of the arrow B2 in the drawings. Therefore, at this point, the engaging pins 70L and 70R serve as a moving and urging member that moves and urges the sliding plate 30 toward the first position from the second position, and the slopes 63L and 63R serve as a cam. Furthermore, the engaging pins 70L and 70R and the slopes 63L and 63R may form a moving and urging mechanism.

Furthermore, when the display part 3 and the base plate 20 are caused to further rotate in the direction of the arrow A2 in the drawings, the engaging pins 70L and 70R enter the engaging recesses 62L and 62R formed in the cam members 60L and 60R, respectively, so that the engaging pins 70L and 70R engage with the engaging recesses 62L and 62R. In this state, the base plate 20 is rotated to the closed position, and the sliding plate 30 is slid to the first position. Furthermore, the display part 3 is moved to a position where the display part 3 is accommodated in the display part accommodating part 4 of the device body 2. That is, as a result of the engagement of the engaging pins 70L and 70R and the engaging recesses 62L and 62R, the electronic device 1 and the opening and closing device 10 enter the closed state as illustrated in FIGS. 2A and 2B, FIG. 4A, and FIG. 5A.

As described above, according to the opening and closing device 10 of this embodiment, when the display part 3 and the base plate 20 are caused to move from the closed position to the open position, by disengaging the engaging recesses 62L and 62R and the engaging pins 70L and 70R by causing the display part 3 and the base plate 20 to move in the direction of the arrow A1 in the drawings, the sliding plate 30 automatically slides from the first position to the second position, and with this sliding, the display part 3 moves to a position where the corner parts P1 and P2 do not come into contact with each other.

Furthermore, when the display part 3 and the base plate 20 are caused to move from the open position to the closed position, the engaging pins 70L and 70R relatively move on the slopes 63L and 63R (the cam members 60L and 60R), respectively, so that the sliding plate 30 automatically slides from the second position to the first position. With this sliding, the display part 3 also moves to the closed position.

Therefore, it is possible to cause the display part 3 and the sliding plate 30 to automatically slide between the first position and the second position by causing the display part 3 and the base plate 20 to move between the open position and the closed position alone.

Furthermore, after the sliding plate 30 is moved to the second position, the display part 3 rotates relative to the device body 2 while keeping a distance between the corner parts P1 and P2. Therefore, even when the display part 3 is large in size, it is possible to ensure that the device body 2 and the display part 3 are prevented from coming into contact (colliding) with each other.

Furthermore, according to the opening and closing device 10 of this embodiment, the base plate 20 rotates about the single axis of the hinge pins 51L and 51R relative to the stands 11L and 11R. Therefore, for example, compared with a configuration using a hinge having two parallel axes, each of an opening operation and a closing operation may be performed with a single action, so that it is possible to improve the operability and to cause the display part 3 and the base plate 20 to rotate with stability.

FIG. 7 illustrates an opening and closing device 80, which is a variation of the opening and closing device 10 according to the above-described embodiment. In FIG. 7, elements corresponding to those illustrated in FIG. 1 through FIGS. 6A and 6B are referred to by the same reference numerals, and their description is omitted.

According to the opening and closing device 10 of the above-described embodiment, the engaging pins 70L and 70R are provided on the stands 11L and 11R, respectively, and the cam members 60L and 60R are provided on the sliding plate 30. On the other hand, in this variation, the cam members 60L and 60R are provided on the stands 11L and 11R, respectively, and the engaging pins 70L and 70R are provided on the sliding plate 30. The same effects may be produced by thus reversing positions at which the cam members 60L and 60R and the engaging pins 70L and 70R are provided relative to the stands 11L and 11R and the sliding plate 30.

Furthermore, according to the above-described embodiment and variation, the stands 11L and 11R (or the sliding plate 30) and the engaging pins 70L and 70R are separate bodies, and the engaging pins 70L and 70R are attached to the stands 11L and 11R (or the sliding plate 30). The stands or the sliding plate and the engaging pins, however, do not necessarily have to be provided separately, and the engaging pins may be provided by performing drawing or burring at the time of press working of the stands or the sliding plate.

Furthermore, according to the above-described embodiment, the cam member 60L and 60R are fixed to the cam attachment parts 35L and 35R, respectively, of the sliding plate 30. Alternatively, the cam members 60L and 60R may be omitted by adding a configuration corresponding to the engaging recesses 62L and 62R and the slopes 63L and 63R to the cam attachment parts 35L and 35R.

Furthermore, according to the above-described embodiment and variation, the cam members 60L and 60R and the engaging pins 70L and 70R are provided on both sides of the opening and closing device 10 in the X1 and the X2 direction in the drawings. The cam members and the engaging pins, however, do not necessarily have to be provided on both sides of the opening and closing device 10 in the X1 and the X2 direction, and a cam member and an engaging pin may be provided only on one side of the opening and closing device 10 in the X1 and the X2 direction as long as the cam member and the engaging pin smoothly slide relative to each other and the engagement of a sliding plate with a stand is ensured by the cam member and the engaging pin provided only on one side.

The present invention is not limited to the specifically disclosed embodiment, and variations and modifications may be made without departing from the scope of the present invention.

For example, according to the above-described embodiment, the position at which the base plate 20 is rotated 180° relative to the stands 11L and 11R is determined as the open position of the base plate 20. The open position, however, is not limited to the position illustrated in the above-described embodiment, and any position of the base plate 20 relative to the stands 11L and 11R may be determined as the open position.

Furthermore, each stand may be formed by connecting multiple links. In this case, each engaging pin is provided on one of the links of the corresponding stand. By having the stands formed of multiple links, it is possible to increase the latitude of the rotational movement of the base plate relative to the stands, so that it is also possible to increase latitude in determining the angle of the sliding plate (liquid crystal display) relative to the stands.

The present application is based upon and claims the benefit of priority of Japanese Patent Application No. 2012-

237172, filed on Oct. 26, 2012, the entire contents of which are incorporated herein by reference.

DESCRIPTION OF THE REFERENCE NUMERALS 1 electronic device
2 device body
3 display part
4 display part accommodating part
5 liquid crystal display
10, 80 opening and closing device
11L, 11R stand
20 base plate
21 base body part
22L, 22R guide rail part
23L, 23R arm part
24L, 24R shaft hole
25 spring pin
30 sliding plate
31 sliding body part
32 opening part
33L, 33R sliding guide
34L, 34R guide attachment part
35L, 35R cam attachment part
36 spring pin
37 pin fixing hole
38 contacting part
40 spring
41, 42 arm part
50L, 50R hinge mechanism
51L, 51R hinge pin
60L, 60R cam member
61L, 61R cam body part
62L, 62R engaging recess
63L, 63R slope
70L, 70R engaging pin

The invention claimed is:

1. An opening and closing device, comprising:
a stand;
a base plate rotatably supported by the stand so as to rotate between a closed position and an open position;
a sliding plate slidably provided on the base plate so as to slide relative to the base plate between a first position where the sliding plate is superposed on the base plate and a second position where the sliding plate projects from the base plate;
an urging part provided on the base plate and configured to urge the sliding plate toward the second position relative to the base plate, the urging part being positioned in an opening formed in the sliding plate when viewed in a direction in which the sliding plate is superposed on the base plate; and
a movement restriction and moving and urging mechanism including a first member provided on one of the stand and the sliding plate and a second member provided on the other of the stand and the sliding plate, wherein the movement restriction and moving and urging mechanism is configured to restrict a movement of the base plate relative to the stand and a movement of the sliding plate relative to the base plate by an engagement of the first member and the second member when the base plate is at the closed position, and is configured to move and urge the sliding plate toward the first position from the second position with a movement of the base plate from the open position to the closed position, wherein the urging part includes an arm part fixed to the base plate by a pin, and when the sliding plate is at the second position, an edge of the opening is in contact with the pin so as to prevent the sliding plate from projecting further from the base plate.

2. The opening and closing device as claimed in claim 1, wherein the movement restriction and moving and urging mechanism includes
a cam provided on the one of the stand and the sliding plate; and
a moving and urging member provided on the other of the stand and the sliding plate and configured to move and urge the sliding plate toward the first position from the second position by engaging with the cam.

3. The opening and closing device as claimed in claim 2, wherein the cam is a resin molding product and is fixed to the one of the stand and the sliding plate.

4. The opening and closing device as claimed in claim 2, wherein the cam is formed as a unit with the one of the stand and the sliding plate.

5. The opening and closing device as claimed in claim 1, wherein
the first member is an engaging projection, and
the second member is an engaging member including an engaging depression configured to engage with the engaging projection.

6. The opening and closing device as claimed in claim 5, wherein the engaging projection is a pin member fixed to the one of the stand and the sliding plate.

7. The opening and closing device as claimed in claim 5, wherein the engaging projection is formed as a unit with the one of the stand and the sliding plate.

8. The opening and closing device as claimed in claim 1, wherein the arm part is positioned in the opening formed in the sliding plate when viewed in the direction in which the sliding plate is superposed on the base plate.

9. The opening and closing device as claimed in claim 1, wherein when the sliding plate is at the first position, the edge of the opening is out of contact with the pin.

* * * * *